United States Patent [19]

Kimbara

[11] Patent Number: 4,710,592
[45] Date of Patent: Dec. 1, 1987

[54] MULTILAYER WIRING SUBSTRATE WITH ENGINEERING CHANGE PADS

[75] Inventor: Kohji Kimbara, Tokyo, Japan

[73] Assignee: NEC Corporation, Tokyo, Japan

[21] Appl. No.: 875,670

[22] Filed: Jun. 18, 1986

[30] Foreign Application Priority Data

Jun. 25, 1985 [JP] Japan .................. 60-138722

[51] Int. Cl.⁴ ............................................. H05K 1/00
[52] U.S. Cl. ..................................... 174/68.5; 29/847; 361/414
[58] Field of Search .......................... 174/68.5; 29/847; 361/397, 414

[56] References Cited

U.S. PATENT DOCUMENTS

| | | | |
|---|---|---|---|
| 3,777,221 | 12/1973 | Tatusko et al. | 361/414 X |
| 3,882,324 | 5/1975 | Smolker et al. | 174/68.5 X |
| 3,898,603 | 8/1975 | Ericchi et al. | 174/68.5 X |
| 4,245,273 | 1/1981 | Feinberg et al. | 361/382 |
| 4,489,364 | 12/1984 | Chance et al. | 361/414 X |
| 4,549,200 | 10/1985 | Ecker et al. | 174/68.5 X |

OTHER PUBLICATIONS

Abolafia, O. R. et al., "Use of Polyimide to Obtain a smooth Surface", IBM Technical Disclosure Bulletin; vol. 20, No. 8; Jan. 1978.

Primary Examiner—Morris H. Nimmo
Attorney, Agent, or Firm—Burns, Doane, Swecker & Mathis

[57] ABSTRACT

A multilayer wiring substrate is disclosed which includes a reconfigurable link structure for effecting wiring change. A plurality of pad portions are connected to a link structure through holes on an insulating layer located therebetween which also acts as a solder dam. A gap is present on a portion of the insulating layer through which a portion of the link structure is exposed. By cutting away the portion so exposed, the link structure is divided, and pad portions connected to the divided portions of the link structure become disconnected. An external wire may be selectively soldered to any one pad portion while the insulating layer acts as a soldering dam for preventing flow of solder onto the base wiring substrate section below the link structure. Because the insulating layer acts as a solder dam, the pad portions may be fabricated with materials conducive to solder wettability and severability.

11 Claims, 16 Drawing Figures

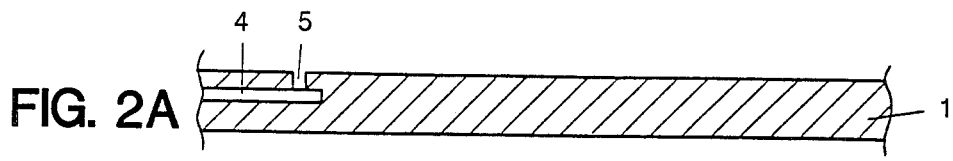
FIG. 2A
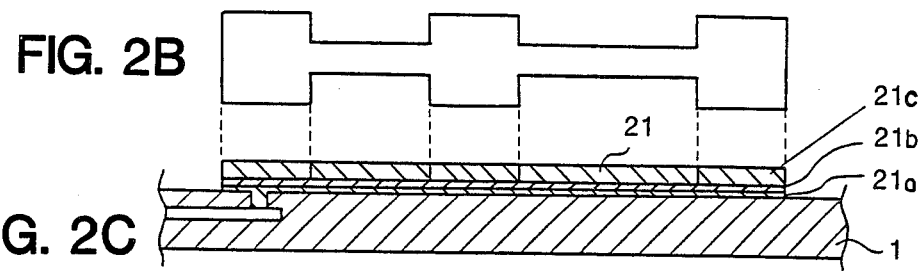
FIG. 2B
FIG. 2C
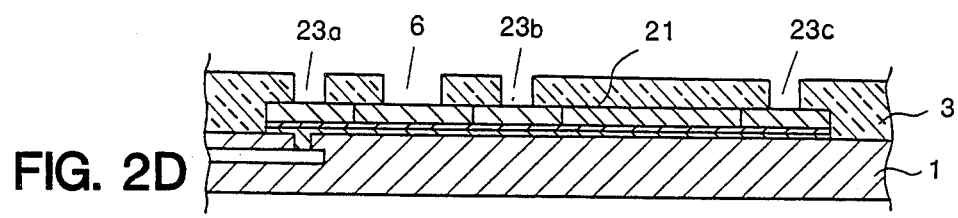
FIG. 2D
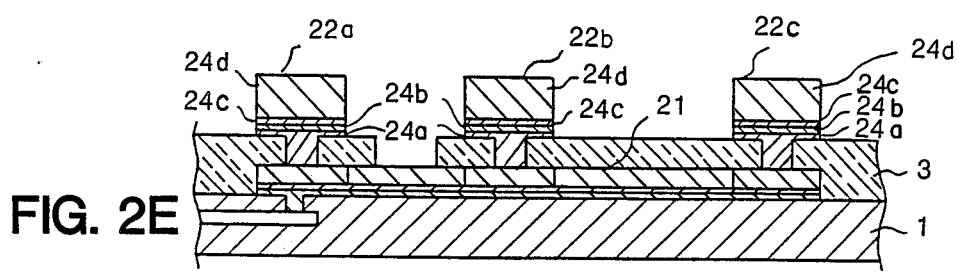
FIG. 2E
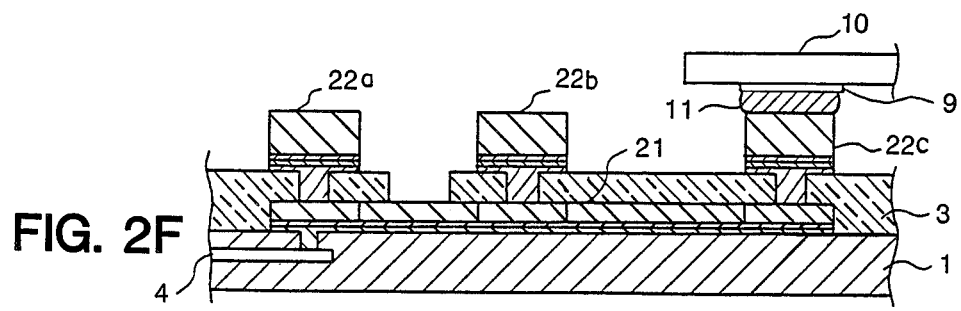
FIG. 2F

FIG. 6B

MULTILAYER WIRING SUBSTRATE WITH ENGINEERING CHANGE PADS

BACKGROUND OF THE INVENTION

This invention relates to a multilayer wiring substrate. An example of prior art multilayer wiring substrates with engineering change pads is disclosed in a paper entitled "Thermal Conduction Module: A High-Performance Multilayer Ceramic Package" by A. J. Blodgett et al., published in the IBM Journal of Research and Developments, Vol. 26, No. 1, January 1982, pp 30 to 36, and U.S. Pat. No. 4,245,273. In the U.S. Pat. No. 4,245,273, each of engineering change pads 20 comprises a pad portion 24 for connecting a wire 38 at the time of the engineering change and a link portion 26 to be severed when attempting such an engineering change. Both the portions 24 and 26 are identical in terms of their layer structures and materials.

In the prior art substrate, when the wire 38 is solder-bonded to the pad portion 24 it is necessary, to form a solder dam on the pad 20 to prevent solder from flowing out over wiring patterns exposed on the substrate. Since the process of forming the solder dam requires the steps of pattern forming and firing, the whole pad 20 should be fabricated with a metal or metals which do not produce oxides. The prior art substrate, therefore, has the disadvantage in that pads cannot be fabricated exclusively with the materials satisfactory in solder wettability and severability.

An object of the invention is, therefore, to provide a substrate free from the above-mentioned disadvantage of the prior art substrate.

SUMMARY

A multilayer wiring substrate is provided which embodies designs for enabling subsequent engineering change in electrical connections. A plurality of pad portions are separately connected to a link structure through holes in an insulating layer located therebetween which also acts as a solder dam. A gap in the insulating layer exposes a portion of the link structure below, for use in effecting any subsequent wiring change.

BRIEF DESCRIPTION OF THE DRAWINGS

Other features and advantages of the invention will become apparent from the following description when taken in conjunction with the accompanying drawings in which:

FIGS. 2A through 2F are cross-sectional views of the fabrication steps of the first embodiment;

FIGS. 6A through 6F are cross-sectional views of the fabrication steps of the second embodiment.

In the drawings, the same reference numerals represent the same structural elements.

DETAILED DESCRIPTION OF THE PREFERRED EMBODIMENTS

Figure 1:
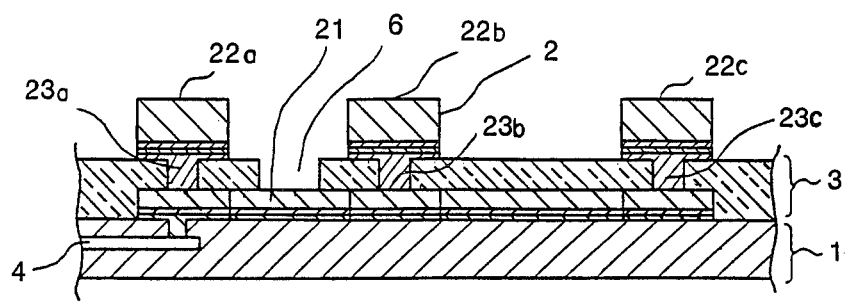
FIG. 1 is a cross-sectional view of a first embodiment of the invention.

Referring now to FIG. 1, a first embodiment of the invention comprises a wiring layer section (substrate) 1 with various wiring patterns (not shown) formed therein and thereon, a plurality of pads 2 for engineering changes formed on the section 1 (only one pad is shown in the drawing), and an insulating layer 3 formed on the section 1. Each pad 2 comprises a link portion 21 covered with the layer 3 except for an exposed portion 6, first, second and third portions 22a, 22b and 22c formed on the layer 3 to oppose the link portion 21 and via fills 23a through 23c which penetrate the layer 3 to connect the link portion 21 electrically to the pad portions 22a through 22c.

Description will now be given to the fabrication process of the embodiment of the invention.

The wiring layer section 1 can be formed as shown in FIG. 2A by the method, for instance, disclosed in the above-mentioned U.S. Pat. No. 4,245,273. In the drawing, wiring patterns in the section 1 other than a wiring pattern 4 are omitted. A via hole 5 is formed on the section 1 to reach the pattern 4. Chromium and palladium are sputtered over the whole surface of the section 1 to form a thin multilayer film having a thickness of several thousand Å (angstroms). The multilayer film thus formed is coated with photoresist. The coated photoresist film is exposed to ultraviolet light and then developed. As a result, a pattern shown in FIG. 2B in the resist film is removed to expose the multilayer film from the removed portion of the resist film. The exposed multilayer film is then electrolytically plated to form a gold film having a thickness of 10 through 30μ (microns). The resist film remaining on the multilayer film acts as a mask to thereby form the gold film in the pattern shown in FIG. 2B. The whole remaining resist film is then removed and the multilayer film exposed by this removal of the resist film is removed by etching. The link portion 21 comprising a chromium film 21a, a palladium film 21b and a gold film 21c consequently is formed on the section 1 as shown in FIG. 2C. An insulating film is then formed on the link portion 21 and the section 1. Further, via holes 23a through 23c penetrating the insulating film to reach the link portion 21 and an exposed portion 6 are formed by a photo-lithography technique to form the insulating layer 3 shown in FIG. 2D. The material used for the insulating layer 3 may be, for instance, polyimide resin of the organic group or glass ceramic paste for low temperature firing of the inorganic group. Finally, the pad portions 22a through 22c are fabricated. More particularly, chromium, palladium and copper are sputtered in that order over the whole surface of the insulating layer 3 to form a thin multilayer film. Then, a photoresist film is formed over the multilayer film, exposed to ultraviolet light and developed. As a result, the resist film is removed only from the portions above the via holes 23a through 23c to expose the multilayer film from the portions. The multilayer film thus exposed is electrolytically plated with copper to form a thick copper film (in the thickness at least greater than the sputtered copper film included in the multilayer film). The whole remaining resist film is then removed to expose the multilayer film below the resist film. The exposed multilayer film in turn is removed by etching. As a result, as shown in FIG. 2E, the pad portions 22a through 22c comprising a chromium film 24a, a palladium film 24b, and copper films 24c and 24d are formed on the insulating layer 3. FIG. 2F shows the state where an electrode 9 of an IC (integrated circuit) chip 10 and the pad 22c are connected by solder 11. If no change is needed in wiring design, the IC chip 10 is electrically connected to the wiring pattern 4 in the wiring layer section 1 via the link portion 21.

Figure 3:
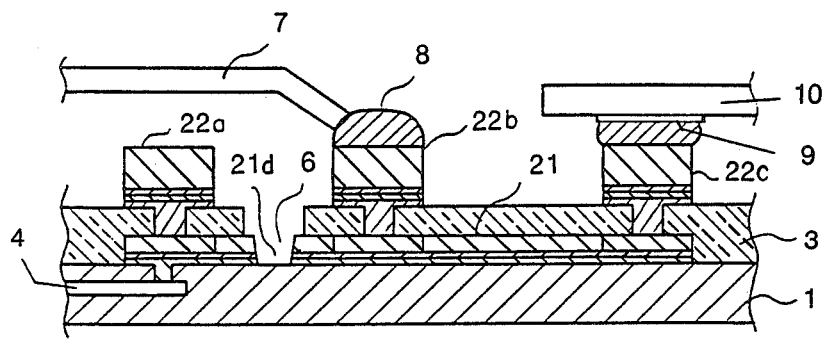
FIGS. 3 and 4 are cross-sectional views for illustrating the connection, of a wire when making an engineering change.
Figure 4:
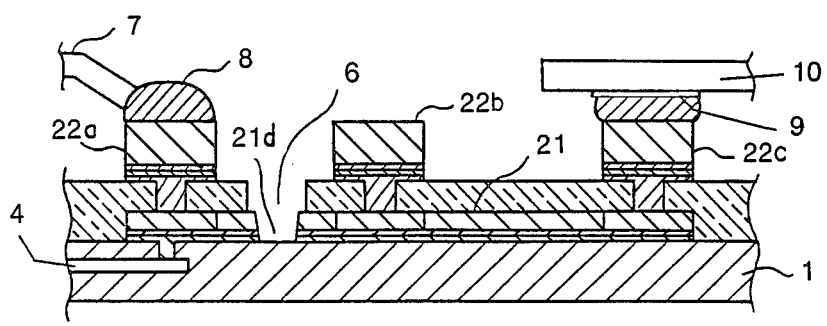

Referring now to FIGS. 3 and 4, specific examples of engineering changes will be described.

FIG. 3 shows a case where the use of the wiring pattern 4 in the wiring layer section 1 should be ceased due to a failure in the pattern or a change in wiring design. First, a region 21d of the link portion 21 opposed to the exposed portion 6 is cut with an ultrasonic cutter or a laser beam device, so that the IC chip 10 and the wiring pattern 4 are electrically disconnected by severing the link portion 21 into two. A wire 7 for engineering change is newly connected to the pad portion 22b with solder 8. This processing electrically disconnects the IC chip 10 from the wiring pattern 4 and connects the same to the wire 7.

FIG. 4 shows a case where the use of the IC chip 10 is suspended. The IC chip 10 and the wiring pattern 4 are electrically disconnected from each other by severing the link portion 21 into two in the manner similar to the above case. Then, a new wire 7 is connected to the pad portion 22a with solder 8. By this processing, the wiring pattern 4 is electrically severed from the IC chip 10 and newly connected to the wire 7.

Alternatively, an engineering change may be made by severing the link portion 21 into two in the similar manner, and connecting new wires with both the pad portions 22a and 22b.

As is described above, the link portion in the embodiment is fabricated by plating gold on the chromium and palladium films formed by sputtering in order to minimize its electrical resistance and to facilitate the above-mentioned severing operation. The pad portion, on the other hand, is fabricated by plating copper of excellent solder wettability on the chromium, palladium and copper films formed by sputtering, so that the pad portion can provide more excellent solder wettability. Since this step of formation of the copper film of the pad portion is the final step in the fabrication process of the multilayer wiring substrate, no copper oxide will be formed advantageously. In the embodiment, the insulating layer 3 acts as a solder dam to prevent the solders 11 and 8 from flowing over the wiring pattern on the wiring layer section 1.

Figure 5:
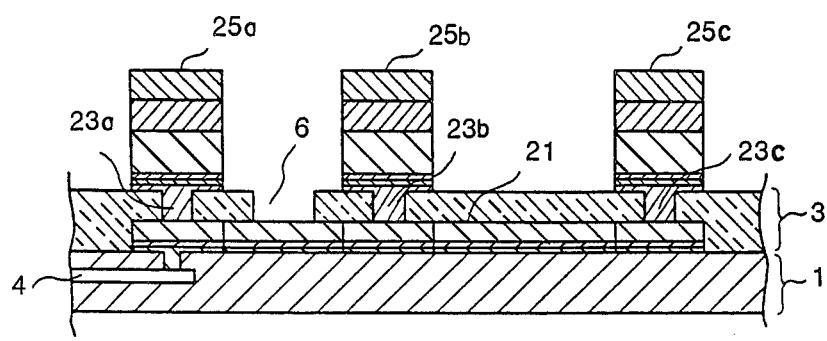
FIG. 5 is a cross-sectional view of the second embodiment of a invention.

Referring to FIG. 5, a second embodiment of the invention has the same structure as the first embodiment except for the structure of first to third pad portions 25a through 25c.

The fabrication process of the second embodiment will now be described in detail.

Figure 6A:
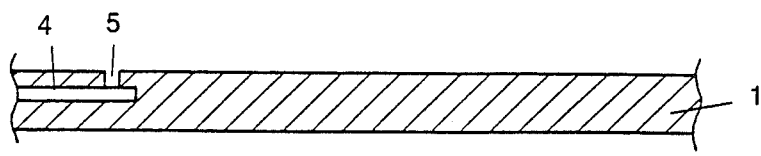
Figure 6C:
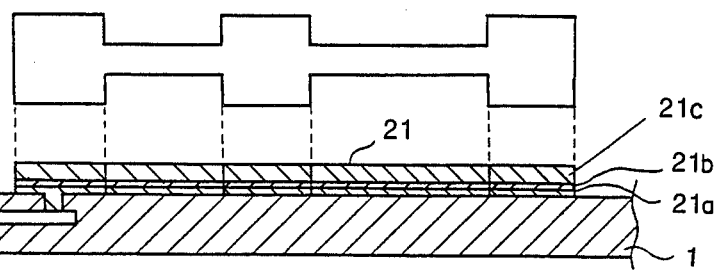
Figure 6D:
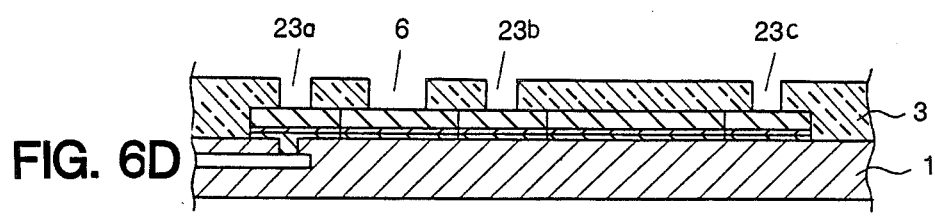
Figure 6E:
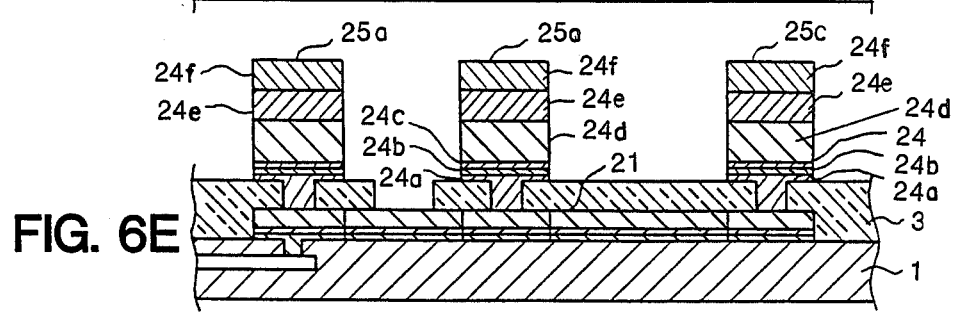

Since the steps until the fabrication of the insulating layer 3, as shown in FIGS. 6A through 6D, are identical to those of the first embodiment, description will be omitted therefor. Chromium, palladium and copper are in turn sputtered on the whole surface of the insulating layer 3 formed as shown in FIG. 6D to form a thin sputtered multilayer film. Thus formed multilayer film is applied with photoresist. The coated photoresist film is exposed to ultraviolet light and then developed. This removes the resist film only from the portions above the via holes 23a through 23c to expose the multilayer film. Copper, nickel and gold are sequentially plated electrolytically on thus exposed multilayer film to form a plated multilayer film. The copper film in the plated multilayer film is formed thicker than the copper film in the sputtered multilayer film. Then, the whole photoresist film remaining on the sputtered multilayer film is removed to expose the sputtered multilayer film. The sputtered multilayer film exposed by the removal of the resist film is subsequently removed by etching. As a result, as shown in FIG. 6E, the pad portions 25a through 25c, each of which comprises a chromium film 24a, a palladium film 24b, copper films 24c and 24d, a nickel film 24e and a gold film 24f, are fabricated on the insulating layer 3.

Figure 6F:
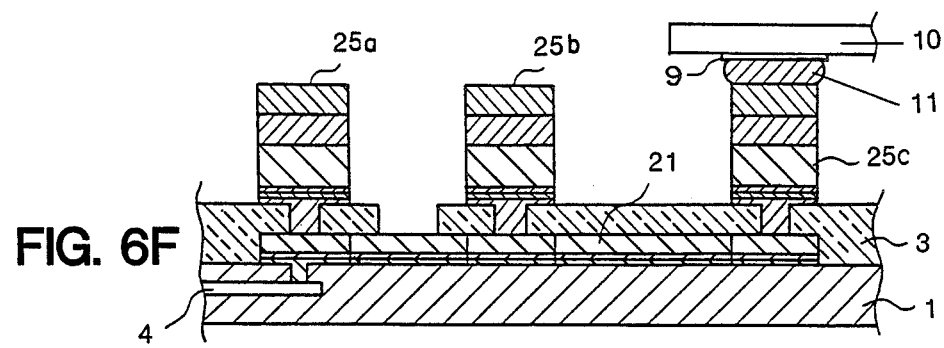

FIG. 6F shows the state wherein the electrode 9 of the IC chip 10 is connected to the pad portion 25c by the solder 11. If there is no change in wiring, the IC chip 10 is electrically connected to the wiring pattern 4 in the wiring layer section 1 via the link portion 21 as shown in the figure.

Since gold is used as the material for the uppermost film in each of the pad portions 25a through 25c in the second embodiment, each pad portion in the second embodiment is less vulnerable to corrosion than that in the first embodiment.

While this invention has been described in conjunction with the preferred embodiments thereof, it will now be readily possible for those skilled in the art to put this invention into practice in various other manners.

What is claimed is:

1. A multilayer wiring substrate comprising:
    a wiring layer section including a plurality of wiring layers and insulating layers laminated alternatively;
    a link structure made of electrically conductive material formed at a predetermined area on said wiring layer section and electrically connected to at least one of said wiring layers;
    a further insulating layer formed on said link structure, and on some regions of said wiring layer section other than said predetermined area;
    said further insulating layer having a plurality of via holes and a gap through which said link structure is exposed; and
    a plurality of pad portions respectively formed on said further insulating layer and contacting said link structure through a corresponding via hole.

2. A multilayer wiring substrate as claimed in claim 1, wherein said link structure comprises two divided portions separated by a space exposed through said gap of said further insulating layer; and a wire is connected to at least one of said pad portions corresponding to the divided link portion.

3. A multilayer wiring substrate as claimed in claim 1, wherein said pad portions and said link structure are fabricated of different conductive materials.

4. A multilayer wiring substrate as claimed in claim 1, wherein said pad portions include copper.

5. A multilayer wiring substrate as claimed in claim 1, wherein the surface of each of said pad portions is made of a noble metal.

6. A multilayer wiring substrate as recited in claim 2, wherein said spaced exposed through said gap is located between adjacent ones of said pads.

7. A multilayer wiring substrate as recited in claim 2, wherein said further insulating layer comprises a solder dam which presents solder from flowing onto the wiring layer section.

8. A multilayer wiring substrate as recited in claim 1, wherein each of said pad portions comprises a copper plating surface over a plurality of metallic films.

9. A multilayer wiring substrate as recited in claim 8, wherein a wire for external coupling is soldered to one of said pad portions for effecting an engineering change;

said further insulating layer acting as a solder dam for preventing solder from flowing onto the wiring layer section.

10. A multilayer wiring substrate as recited in claim 1, wherein each of said pad portions comprises a gold plating surface over a plurality of metallic films.

11. A multilayer wiring substrate as recited in claim 10, wherein a wire for external coupling is soldered to one of said pad portions for effecting an engineering change;

said further insulating layer acting as a solder dam for presenting solder from flowing onto the wiring layer section.

* * * * *